United States Patent
Wang et al.

(10) Patent No.: US 8,836,365 B2
(45) Date of Patent: Sep. 16, 2014

(54) APPARATUS AND METHOD FOR TESTING ELECTROMIGRATION IN SEMICONDUCTOR DEVICES

(75) Inventors: Yun Wang, San Jose, CA (US); Tony P. Chiang, Campbell, CA (US); Chi-I Lang, Cupertino, CA (US)

(73) Assignee: Intermolecular, Inc., San Jose, CA (US)

( * ) Notice: Subject to any disclaimer, the term of this patent is extended or adjusted under 35 U.S.C. 154(b) by 960 days.

(21) Appl. No.: 12/957,346

(22) Filed: Nov. 30, 2010

(65) Prior Publication Data

US 2012/0136468 A1     May 31, 2012

(51) Int. Cl.
  *G01R 31/02*  (2006.01)
  *G01R 31/28*  (2006.01)

(52) U.S. Cl.
  CPC ................ *G01R 31/2858* (2013.01)
  USPC .................................... 324/762.01

(58) Field of Classification Search
  CPC ........... G01R 31/2858; G01R 31/2831; G01R 31/2607; G01R 31/2856; G01R 31/275; G01R 31/2863; G01R 27/14; G01R 31/2642; G01R 31/2884
  See application file for complete search history.

(56) References Cited

U.S. PATENT DOCUMENTS 6,816,995 B2 *  11/2004  Yokogawa .................... 716/115
8,432,177 B2 *  4/2013   Wang et al. .............. 324/761.01

* cited by examiner

Primary Examiner — Tung X Nguyen

(57) ABSTRACT

An apparatus and method for testing electromigration in semiconductor devices includes providing an electromigration test structure, where the electromigration test structure includes a first metal line; a metal bridge operatively coupled to the first metal line; a second metal line operatively coupled to the metal bridge; a barrier layer surrounding the electromigration test structure; current contact pads; and voltage contact pads. The current contact pads are connected to a current source and the voltage contact pads are connected to a voltage source. The barrier layer is exposed to the elevated current density as current travels from the first metal line across the barrier layer through the metal bridge to the second metal line.

20 Claims, 13 Drawing Sheets

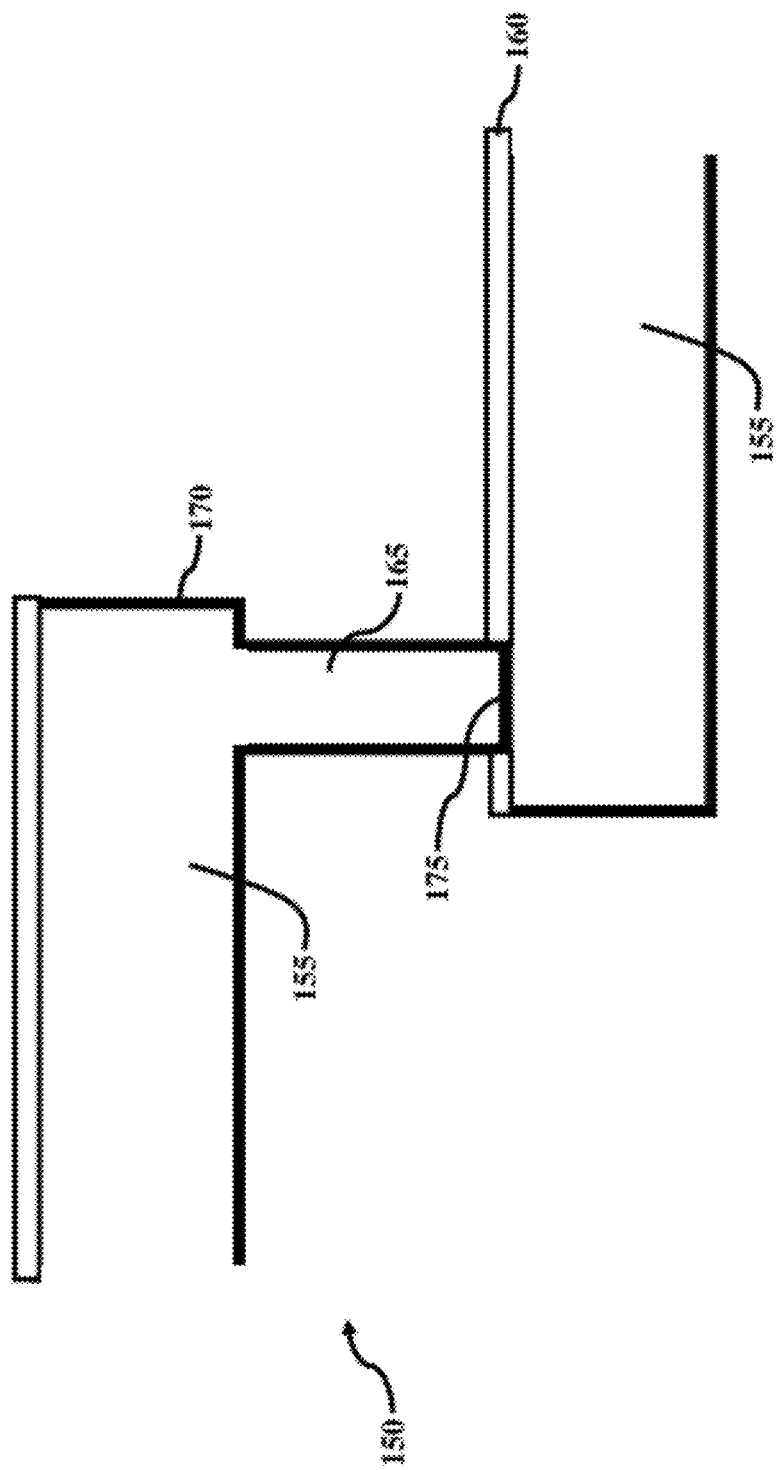

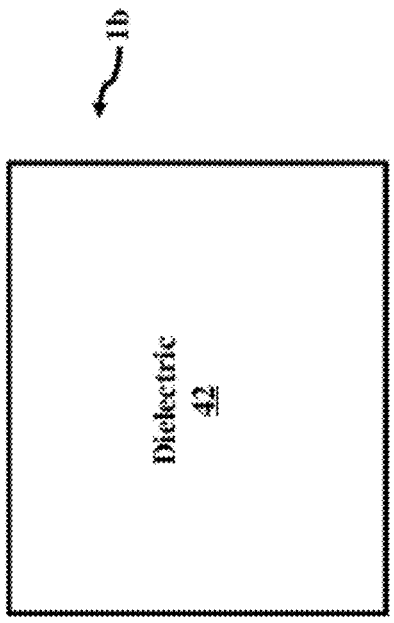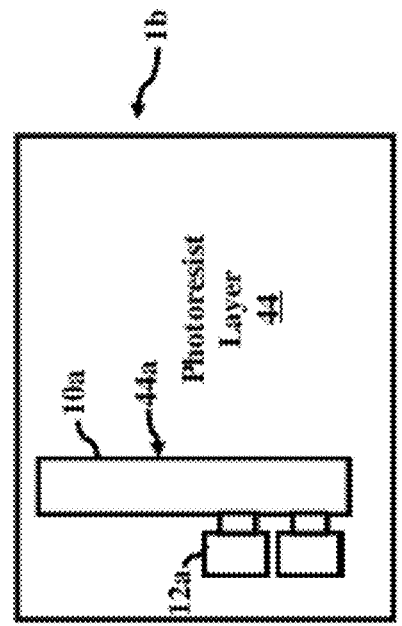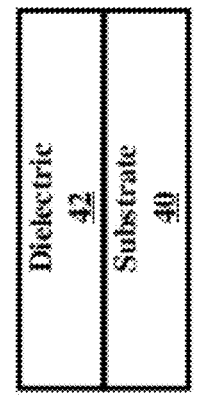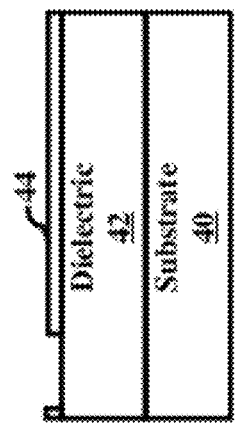
FIG. 3A
FIG. 3B

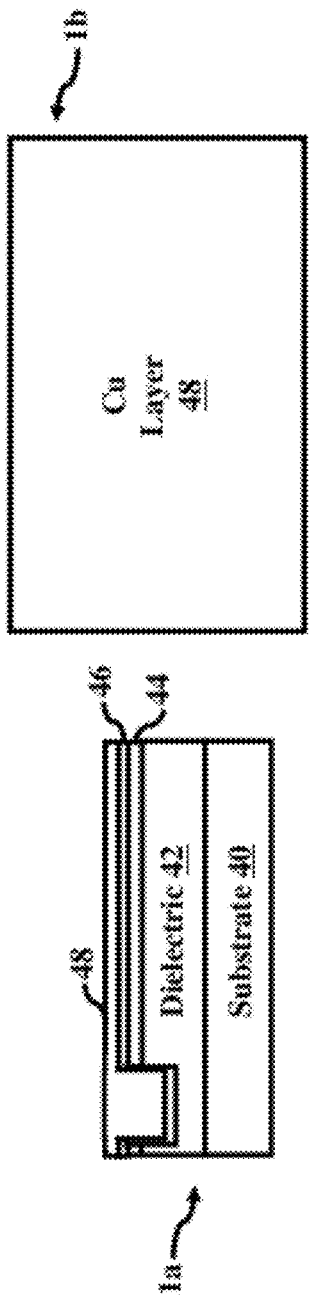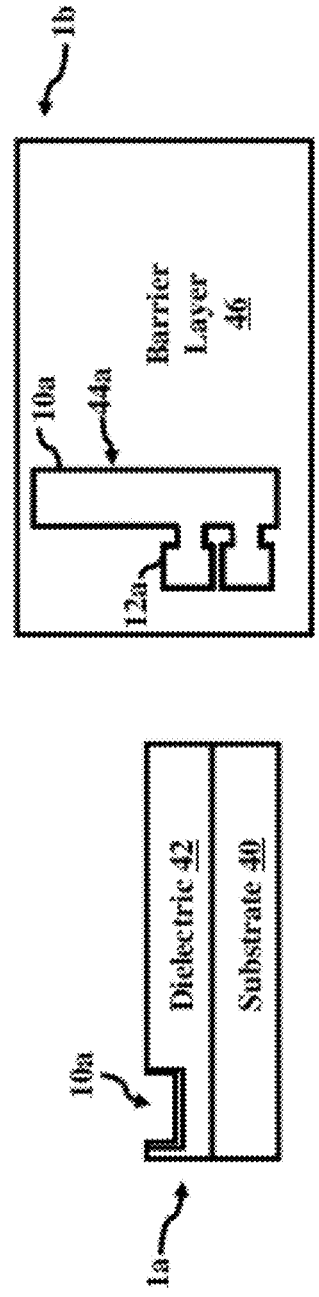

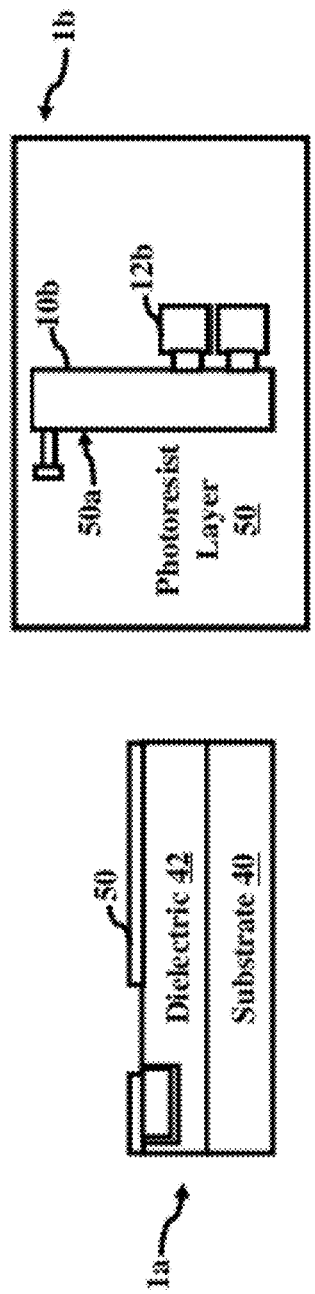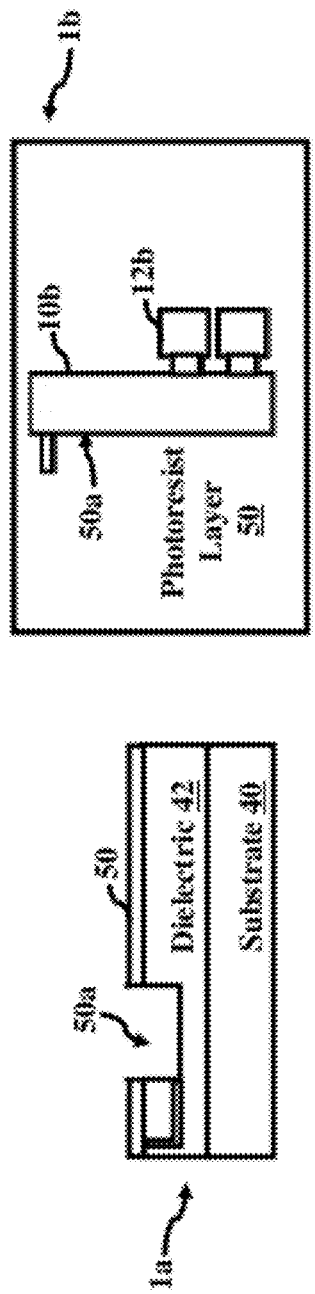

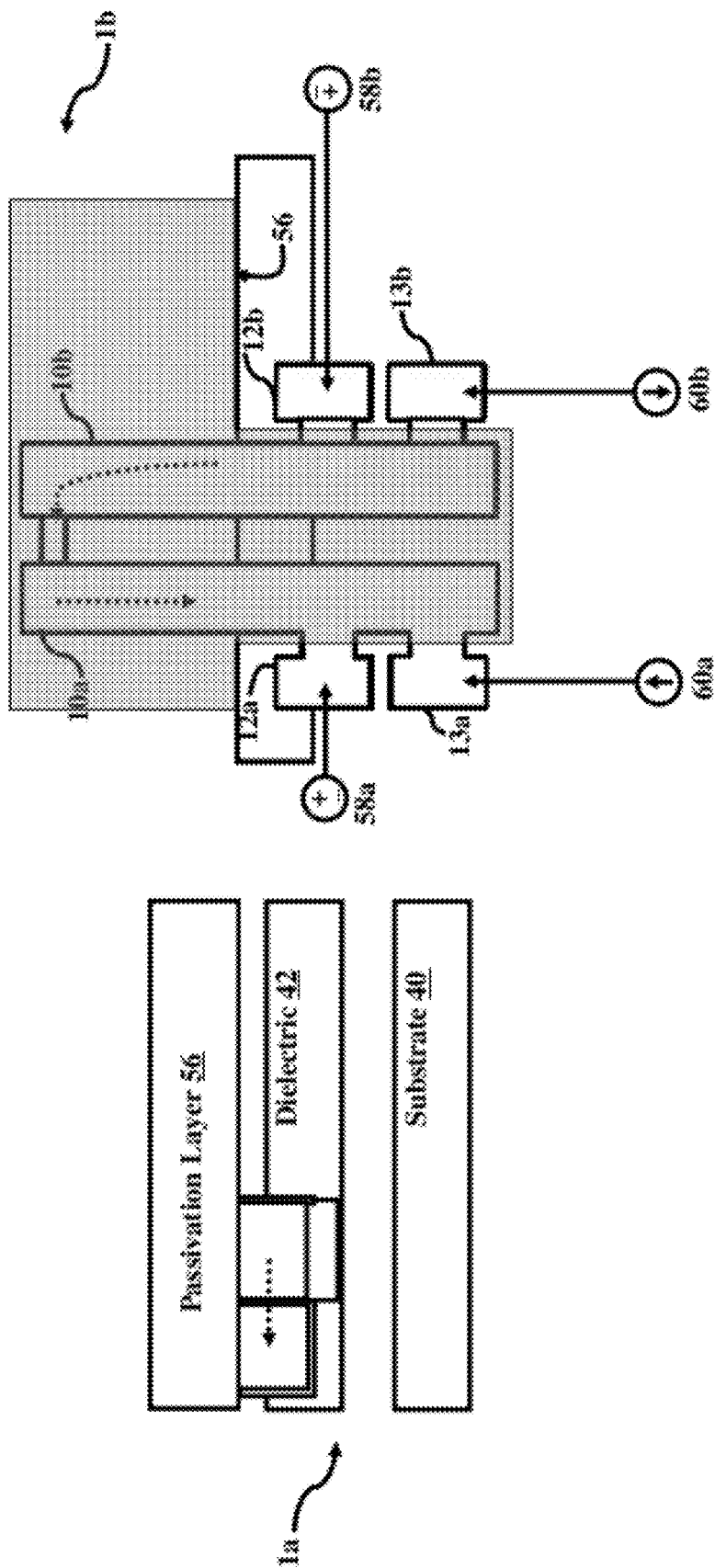

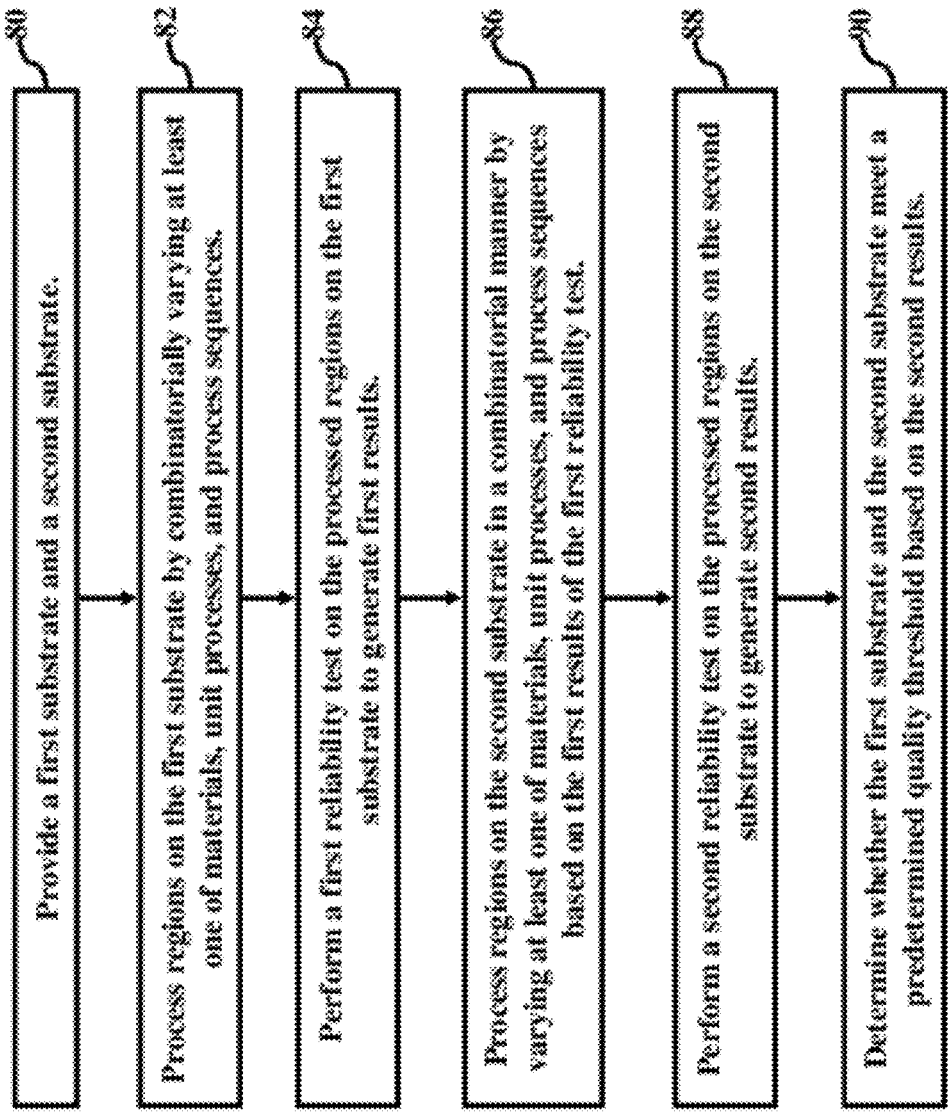

APPARATUS AND METHOD FOR TESTING ELECTROMIGRATION IN SEMICONDUCTOR DEVICES

BACKGROUND

1. Technical Field

The embodiments herein generally relate to semiconductor processing and characterization, and more specifically, to an electromigration testing technique for semiconductor devices.

2. Description of the Related Art

The ability to process uniformly across a monolithic substrate and/or across a series of monolithic substrates is advantageous for manufacturing efficiency and cost effectiveness, as well as repeatability and control. However, uniform processing across an entire substrate can be disadvantageous when optimizing, qualifying, or investigating new materials, new processes, and/or new process sequence integration schemes, since the entire substrate is nominally made the same using the same materials, processes and process sequence integration schemes. Each processed substrate generally represents, in essence, only one possible variation per substrate. Thus, the full wafer uniform processing under conventional processing techniques results in fewer data points per substrate, longer times to accumulate a wide variety of data and higher costs associated with obtaining such data.

For example, lifetime and reliability characteristics are a very important specification for any new or existing product. Lifetime and reliability tests are usually tested with accelerated conditions such as high temperature, voltage, longer time, etc. Electromigration (EM) is an important and indispensable reliability test for back end of line (BEOL) application. For any new product or technology node, all wafers with new material and processes generally have to pass EM lifetime criteria before being introduced into a market.

To accurately perform EM tests and evaluate the lifetime of a device, a properly designed test structure is crucial. Although many structures are available, conventional test structures can be divided into two categories. The first category of test structures is characterized by their simplicity and ease of fabrication and includes so-called dog-bone test structures and standard wafer-level EM test structures (SWEAT). The first category of test structures, however, typically can only be used to test the copper line quality and generally are not suitable to evaluate the EM performance of a barrier layer of a via. The second category of test structures is typically suitable to evaluate the EM performance of the barrier layer, but is neither simple nor easy to fabricate. Structures in this second category follow the standard BEOL metal 1 and metal 2 processing by using copper dual damascene flow with advanced lithography and chemical-mechanical planarization (CMP) process. Since they are similar to final products, structures in the second category are generally used to evaluate all potential problems including the barrier layer. However, the device fabrication process is extremely complicated and resource demanding, and it is usually performed in a wafer factory (e.g., fab).

Moreover, using conventional technology to test the EM of a barrier layer, the entire wafer is generally used to evaluate a single process condition. Generally, the conventional unit process and test workflow used in current industry is complicated, time consuming, and not very cost efficient. Currently, each process is performed on one wafer at metal 1 or higher layer. Then, the wafer is passivated and at least four more layers are deposited, or the wafer is packaged, and then reliability testing is performed. To know the result of each condition, one wafer with many follow-up steps is required, which under current technology is very complicated as well as cost inefficient. For example, semiconductor companies conduct research and development (R&D) on full wafer processing through the use of split lots, as the deposition systems are designed to support this processing scheme. This approach has generally resulted in high R&D costs and the inability to conduct extensive experimentation in a timely and cost effective manner.

Generally, for the purpose of evaluating the barrier layer, the available structures are either complicated or not useful. The barrier layer cannot be ignored, however, and is an important component for next generation BEOL systems. In addition, a high performance barrier layer effectively prevents copper diffusion into surrounding dielectrics and significantly increases the lifetime of a device. With the urgent demand of finding the appropriate material and process for next generation barrier layers, a simple and effective EM test structure is required.

BRIEF DESCRIPTION OF THE DRAWINGS

The embodiments herein will be better understood from the following detailed description with reference to the drawings, in which:

FIG. 1B illustrates a cross-section view of a three-dimensional (3D) EM test structure according to an embodiment herein;

FIGS. 3A through 3M illustrate sequential structures, shown in cross-sectional and top views, of a planar EM test structure being fabricated according to the embodiments herein;

FIG. 4B illustrates a flow diagram of a test method according to an embodiment herein.

DETAILED DESCRIPTION

Figure 1A:
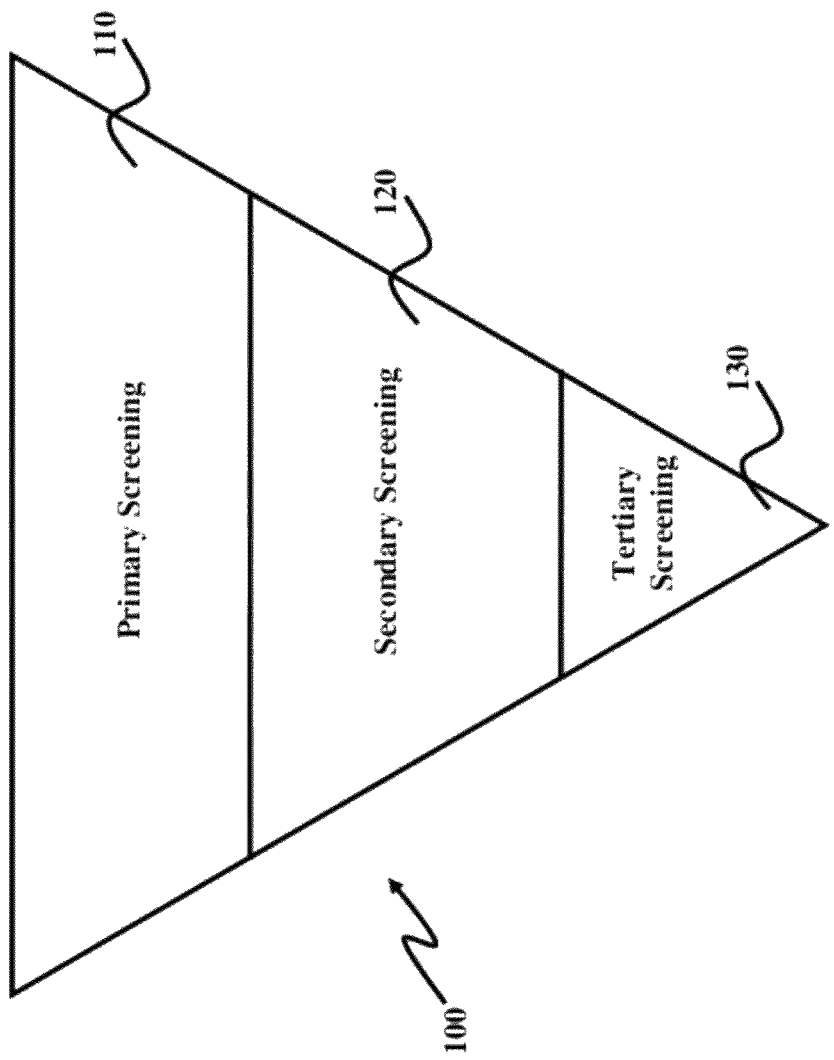
FIG. 1A illustrates a schematic diagram of a combinatorial screening process according to an embodiment herein.

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

The embodiments herein provide a high performance EM test structure and methodology. Referring now to the drawings, and more particularly to FIGS. 1A through 4C, where similar reference characters denote corresponding features consistently throughout the figures, there are shown several embodiments.

Combinatorial processing systems are only as good as the characterization available. Therefore, the high performance EM technique described herein provides the means by which enhanced EM experimentation may be accomplished. The operator burden can be minimized by test automation. The test time can be significantly reduced by parallel testing by measuring multiple sites at the same time instead of measuring one at a time. Although the EM technique described herein exhibits extraordinary utility in the field of combinatorial processing (e.g., by enabling enhanced EM experimentation), the embodiments herein, however, are not limited to combinatorial processing. Thus, the use of the EM technique described herein in combinatorial processing systems represents one of many valuable applications of the embodiments herein.

For example, the manufacturing of semiconductor devices, integrated circuits (IC) devices, microelectromechanical systems (MEMS), nanoelectromechanical systems (NEMS), flat panel displays, optoelectronics devices, data storage devices, magneto electronic devices, magneto optic devices, packaged devices, solar devices, and the like entails the integration and sequencing of many unit processing steps. IC manufacturing, for example, typically includes a series of processing steps such as cleaning, surface preparation, deposition, lithography, patterning, etching, planarization, implantation, thermal annealing, and other related unit processing steps. The precise sequencing and integration of the unit processing steps enable the formation of functional devices meeting desired performance specifications such as speed, power consumption, yield, and reliability. Furthermore, the tools and equipment employed in device manufacturing have been developed to enable the processing of ever-increasing substrate sizes such as the move to twelve inch (or 300 millimeter) diameter wafers in order to fit more ICs per substrate per unit processing step for productivity and cost benefits. Other methods of increasing productivity and decreasing manufacturing costs include the use of batch reactors whereby multiple monolithic substrates can be processed in parallel. In these processing steps, a monolithic substrate or batch of monolithic substrates are processed uniformly; i.e., in the same fashion with the same resulting physical, chemical, electrical, and the like properties across a given monolithic substrate.

The embodiments herein support and enable efficient combinatorial processing. For example, in an embodiment described below, combinatorial processing provides rapid evaluation of semiconductor processing operations. Some exemplary semiconductor processing operations include operations for adding (depositions) and removing layers (etching), defining features, preparing layers (e.g., cleans), doping, etc. In such an embodiment, the systems supporting the combinatorial processing are flexible to accommodate the demands for running the different processes either in parallel, serial, or some combination of the two.

As used herein, combinatorial processing may include any processing (e.g., semiconductor processing) that varies the processing conditions in two or more regions of a substrate. A substrate may be, for example, a silicon substrate such as a wafer that is used in semiconductor processing. A region of a substrate may be any portion of the substrate that is somehow defined, for example by dividing the substrate into regions having predetermined dimensions or by using physical barriers, such as sleeves, over the substrate. The region may or may not be isolated from other regions. For example, a substrate may be divided into two or more regions, each of which may or may not include semiconductor device structures (e.g., metallization such as interconnects and vias, active elements such as transistors, etc.).

It should be appreciated that a region may be adjacent to another region in one embodiment or the regions may be isolated and, therefore, non-overlapping. When the regions are adjacent, there may be a slight overlap wherein the materials or precise process interactions are unknown, however, a portion of the regions, normally at least 60% or more of the area, is uniform and all testing occurs within that region. Furthermore, the potential overlap is only allowed with materials or processes that will not adversely affect the result of the tests. Both types of regions are referred to herein as regions or discrete regions.

A process may be performed at each of the regions. For example, a first region is cleaned using a first cleaning agent, and a second region is cleaned using a second cleaning agent. The efficacies of the two cleaning agents are evaluated, and none, one, or both of the cleaning agents may be selected as suitable candidates for larger scale processing (e.g., on regions with structures, regions enabling more sophisticated testing or a full wafer). According to other examples, multiple iterations of the same experiment are performed on the same substrate, and any number of regions may be defined. For example, five cleaning solutions may be tested using fifteen regions of a substrate, each cleaning solution being tested three times.

Contrary to conventional systems (e.g., traditional accelerated life test (ALT)), one embodiment herein includes an ALT during BEOL processing of a wafer, where only the first metal layer (i.e., M1 layer) is exposed. The term "BEOL" or back end of line processing, as used herein, generally refers to a stage(s) of production of a semiconductor chip after the first metallization. As such, the term "first metal layer" or "M1 layer" (may also be referred to as "BEOL levels"), as used herein, generally refers to portions; i.e., levels and/or layers, associated with a semiconductor chip after first metallization.

For example, after combinatorial processing of material compositions on a single wafer, there is no subsequent passivation or metal pattern layer in one embodiment described herein and an ALT (e.g., EM test to evaluate a barrier layer) is directly performed with the M1 layer still exposed. Such a technique is not possible in conventional processes given the testing parameters used in conventional solutions. Moreover, in one embodiment described herein, the combinatorial processing described above includes parametric testing (e.g., leakage, resistance, and capacitance tests) of material compositions (e.g., process conditions) on a single wafer and is performed as a first stage of screening. Thereafter, the material compositions that do not meet a pre-determined set of requirements are filtered and removed from further consideration.

Figure 2A:
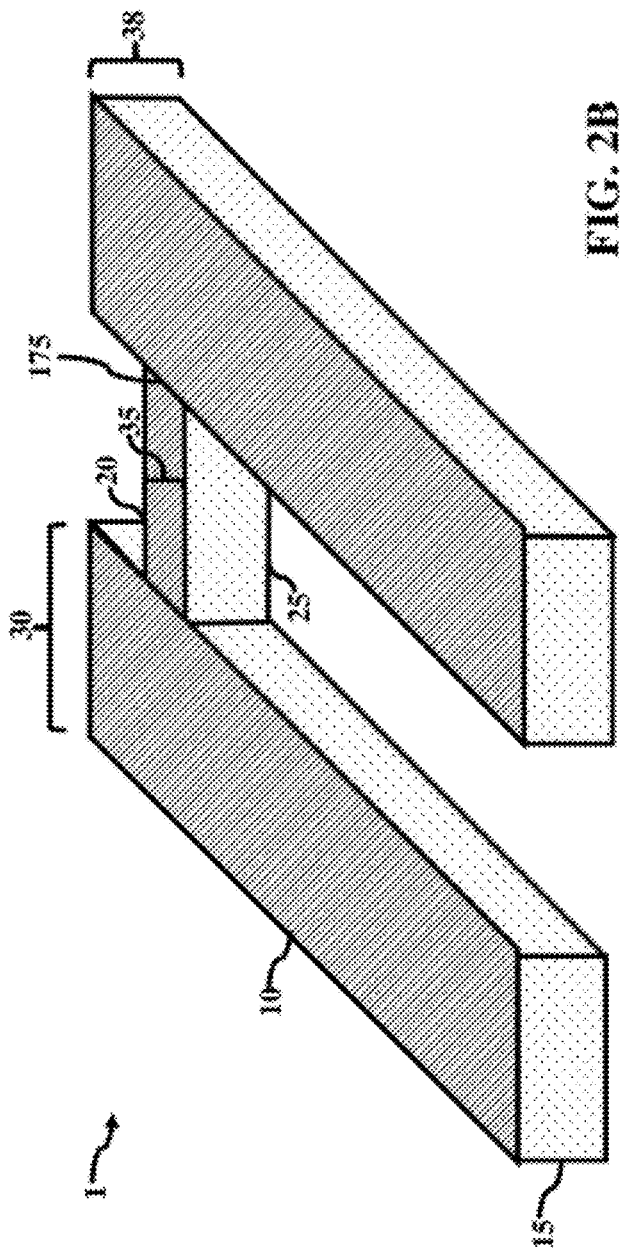
FIG. 2A illustrates a perspective view of a planar EM test structure according to an embodiment herein.

As used herein, reliability is the probability that a system (component, etc.) can successfully perform its intended functions, within stated conditions, for a specified period of time. As described above, combinatorial processing may include any processing that varies the processing in two or more regions of a substrate. The combinatorial methodology, in embodiments described herein, may include multiple levels of screening to identify, for example, materials, process conditions, process ordering, or process integration for further variation and optimization. For example, in one embodiment herein, each wafer is subjected to many different process conditions. FIG. 1A, with reference to FIG. 2A, illustrates a diagram of combinatorial screening process 100 showing three levels of screening for the development of optimal EM process conditions using combinatorial methodologies. As shown in FIG. 1A, combinatorial screening process 100 includes primary screening process (110), secondary screening process (120), and tertiary screening process (130). Combinatorial screening process 100 is shown as a funnel in FIG. 1A, where the primary screening (110) includes the largest number of samples of barrier layers and funneling down to the secondary screening (120) and the tertiary screening (130) where the least number of samples of the barrier layers are tested. The number of samples used at any of the screening levels may be dependent on the substrate or tools used to process the samples.

In FIG. 1A, for example, numerous material compositions (e.g., 18 spots or 46 spots on a single wafer, where each spot is a unique material composition) are systematically explored (e.g., testing for low sheet resistance using X-Ray Diffraction (XRD), Scanning Electron Microscopy (SEM), and Atomic Force Microscopy (AFM) metrological methods) on a single wafer during an initial primary screening process (110) to discover material properties (e.g., as a barrier layer (e.g., barrier layer 15 shown in FIG. 2A)) in a BEOL process) at speeds that would otherwise be impossible using traditional methods and tools. In other words, in the embodiment shown in FIG. 1A, primary screening process (110) is an initial screening that processes many samples to rule out materials for further screening (e.g., materials that are not suitable for use as a barrier layer in a BEOL process). Once the best materials, process conditions, or process integration are identified using initial combinatorial screening methods (e.g., during primary screening process (110)), that material is then scaled up to test the performance (e.g., EM performance, as described in further detail below) of that material and/or conditions during a secondary screening stage (e.g., secondary screening process (120)). In addition, according to one embodiment herein, secondary screening stage (120) may also include parametric testing where parametric testing includes at least one of leakage, resistance, and capacitance tests. According to one embodiment herein, an optimal test structure is fabrication (as described below) to quickly and efficiently test the EM performance of the process conditions. Furthermore, according to one embodiment herein, additional testing may take place during tertiary screening process (130). During tertiary screening process (130), for example, the materials and/or process conditions that were not filtered out during primary screening process (110) and secondary screening process (120) are scaled up to a full-scale device size. Furthermore, due to the speed and performance of the reliability test (described in further detail below) occurring in secondary screening process (120), materials and/or conditions that pass both the primary screening process (110) and secondary screening process (120) can rapidly proceed to tertiary screening process (130). Consequently, to test the performance of these material compositions, embodiments herein utilize an improved measurement tool to enable the collection of information more rapidly.

As described above, tertiary process screening (130) includes scaling materials and/or process conditions that pass both the primary screening process (110) and secondary screening process (120) up to full-scale devices. As discussed in further detail below, the embodiments herein provide a planar device (e.g., EM test structure 1, shown in FIG. 2A) that, according to one embodiment herein, provides comparable EM test performance to 3D devices (e.g., 3D EM test structure 150, shown in FIG. 1B). FIG. 1B, with reference to FIG. 1A, illustrates a schematic diagram of a 3D EM test structure 150 that, according to one embodiment herein, is a scaled-up version of a planar device (e.g., EM test structure 1, shown in FIG. 2A) to a full-scale device as described in tertiary process screening (130). According to the embodiment shown in FIG. 1B, the 3D EM test structure 150 includes a silicon nitride (SiN) layer 160, copper (Cu) line 155, copper vertical interconnect access (via) 165, and barrier layer 170. As described in further detail below, EM reliability tests at intersection 175, where barrier layer 170 and copper via layer 165 interface one another, is extremely expensive and time consuming using conventional systems. Consequently, the embodiments herein postpone fabrication and testing of the 3D EM test device 150 until tertiary process screening (130) occurs; that is after materials and/or process conditions have combinatorially undergone testing in primary process screening process (110) and secondary process screening process (120).

It should be appreciated that various other combinations of conventional and combinatorial processes can be included in the processing sequence with regard to FIG. 1A. That is, the combinatorial process sequence integration can be applied to any desired segments and/or portions of an overall process flow. Characterization, including physical, chemical, acoustic, magnetic, electrical, optical, etc. testing, can be performed after each process operation, and/or series of process operations within the process flow as desired. The feedback provided by the testing is used to select certain materials, processes, process conditions, and process sequences and eliminate others. Furthermore, the above flows can be applied to entire monolithic substrates (e.g., wafers) or portions of monolithic substrates (e.g., as test coupons or wafer coupons).

FIG. 2A, with reference to FIGS. 1A and 1B, illustrates a schematic diagram of an EM test structure 1 according to an embodiment herein. As shown in FIG. 2A, the EM test structure 1 includes Cu line 10, barrier layer 15, Cu bridge 20, bridge barrier layer 25, and intersection 175 (which is the interface between Cu line 10, barrier layer 15, and Cu bridge 20). In addition, Cu line 10 further includes a line width 30 and a bridge width 35. The EM test structure 1 further includes a depth 38. The EM test structure 1 is configured in a planar pattern according to an embodiment herein and is used to test the EM performance of materials used to build vertical interconnect access (via) structures (e.g., Cu bridge 20 and bridge barrier layer 25) in complex 3D devices (e.g., 3D EM test structure 150). EM test structure 1 is planar in the sense that it does not require multiple metallization layers. In other words, as described in further detail below, EM test structure 1 is fabricated in two lithographical steps. Therefore, unlike conventional systems, EM test structure 1 does not require dual damascene and CMP processing to test the EM performance of materials used to build via structures. As described below, EM test structure 1 provides comparable EM test performance of complex 3-D structures (e.g., 3D EM test structure 150, which does require dual damascene and CMP processing during fabrication) on essentially a planar pattern that is quickly and easily fabricated using previous generational (and correspondingly, readily and inexpensively accessible) fabrication equipment (e.g., equipment used to fabricate 90 nm node devices).

Figure 2B:
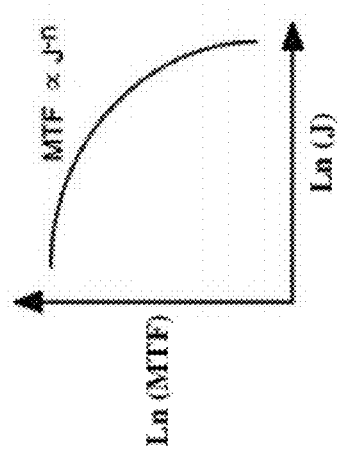
FIG. 2B illustrates a graphical representation of the mean time to failure with respect to current density of a test structure according to an embodiment herein.

As shown in the graph of FIG. 2B, with reference to FIGS. 1A and 2A, the mean time to failure (MTF) with respect to EM failure is highly dependent on current density (J). In particular, EM failure may be expressed as $$MTF = \frac{A}{J^2} \exp\left(\frac{E_a}{kT}\right),$$

where A is a scaling factor that depends on a device's (e.g., EM test structure 1) geometry and material parameters, J is the current density, $E_a$ is the activation energy, k is the Bolzman constant, and T is the temperature (as measured in Kelvin). FIG. 2B illustrates that line mean time to failure (e.g., see Ln (MTF) along the Y-axis) decreases as the line current density (e.g., see Ln (J) along the X-axis) increases. To achieve EM test performance in a simple test structure (e.g., EM test structure 1) comparable to complex test structures (e.g., the 3D EM test structure 150), the embodiments herein increase the current density at Cu bridge 20 and bridge barrier layer 25 to be comparable to the via (e.g., copper via 165) and barrier layers (e.g., barrier layer 170) in more complex devices (e.g., the 3D EM test structure 150).

According to one embodiment herein, the EM test structure 1 achieves sufficient current density to test the EM reliability (and hence, the EM performance) of a barrier layer (e.g., barrier layer 25) by scaling the line width 30 relative to the bridge width 35. For example, the ratio of current density flow (J) through a via (e.g., Cu bridge 20) and line (e.g., Cu line 10) is $$\frac{J_{VIA}}{J_{Line}} = \frac{W \cdot t}{F \cdot t} = \frac{W}{F},$$

where $J_{VIA}$ is the current density of a via (e.g., Cu bridge 20), $J_{Line}$ is the current density of a line (e.g., Cu Line 10), W is the width of the line (e.g., line width 30), F is the width of the via (e.g. bridge width 35), and t is the depth of EM device 1 (e.g., depth 38). Clearly, the depth t (e.g., depth 38) may be cancelled out, leaving the ratio $$\frac{W}{F},$$

where W is the width of the line (e.g., line width 30) and F is the width of the via (e.g., bridge width 35). For example, for a 5× current density ratio, line width 30 is 10 μm and the bridge width 35 is 2 μm. Consequently, the EM test structure 1 provides a singular dimensional control (e.g., line width 30 and bridge width 35) supplied by a simple and effectively fabricated planar pattern and thereby provides simple control of current density ratio (e.g., by adjusting the line width 30 and the bridge width 35) to effectively test the EM failure at the barrier layer (e.g., barrier layer 25).

Figure 3C:
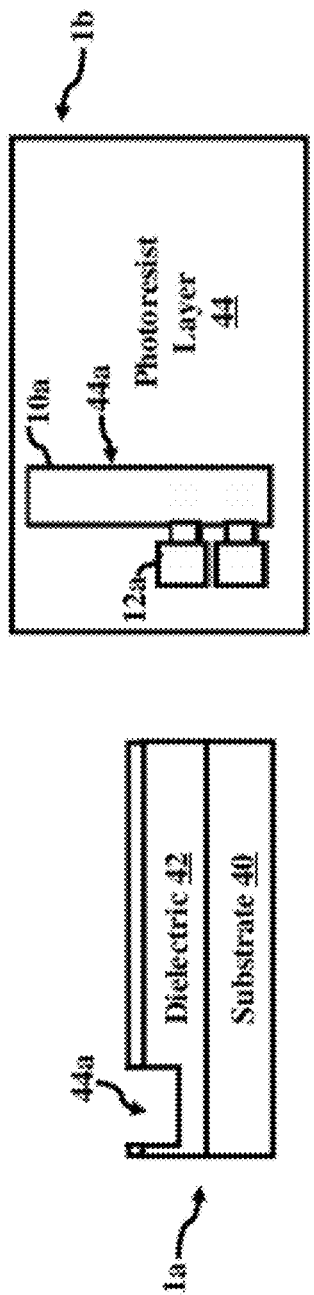
Figure 3D:
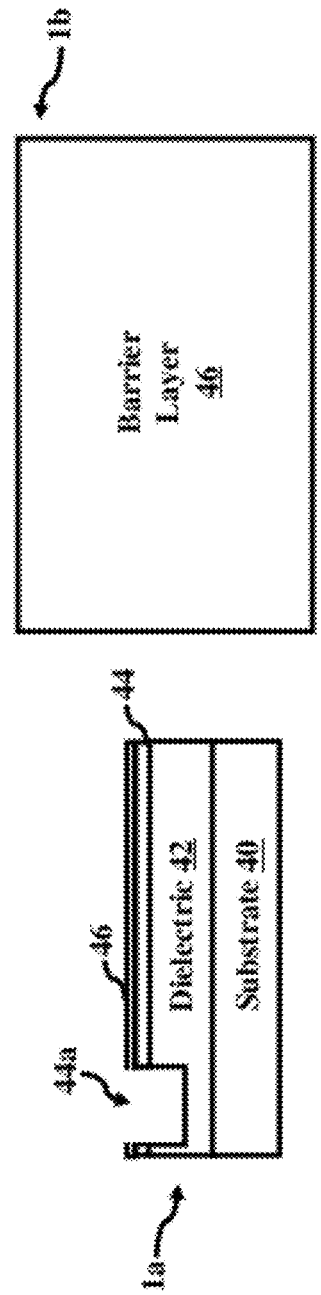

FIGS. 3A through 3M, with reference to FIGS. 1A through 2B, illustrate sequential fabrication steps for an EM test structure (e.g., EM test structure 1) according to the embodiments herein. In FIGS. 3A through 3M, two views are shown of the same device; view 1a illustrates a cross-sectional view of EM test structure 1 and view 1b illustrates a top view of EM test structure 1. FIG. 3A illustrates a blanket dielectric layer 42 (e.g., SiO₂ or any other low k dielectric) on substrate 40 (e.g., a silicon substrate). FIG. 3B illustrates a first photoresist layer 44 layered onto dielectric 42 and patterned with pattern 44a that exposes a first metal line (e.g., first Cu line 10a) and a first set of contact pads (e.g., contact pad 12a). In FIG. 3C, after first photoresist layer 44 has been patterned, the pattern 44a imprint on dielectric 42 is etched away (e.g., using a wet or a dry etch) to define the dimensions of a first copper line (e.g., first Cu line 10a). FIG. 3D illustrates a blanket deposition (e.g., physical vapor deposition (PVD) or atomic layer deposition (ALD), etc.) of a first barrier layer 46 that step covers the patterned dielectric 42. In combinatorial testing, the barrier layer (e.g., barrier layer 15) may be varied either in material composition or process conditions. Examples of this variation include variations on barrier layer thickness and variations on the barrier layer formulation (e.g., a 10-nm-thick Ti—Si—N ternary amorphous barrier layer may be one such variation used during combinatorial testing). Next, FIG. 3E illustrates a blanket deposition (e.g., PVD or ALD, etc.) of a first Cu metallization layer (e.g., first Cu layer 48), which fills the exposed pattern imprint 44a in dielectric 42 to form first Cu line 10a. FIG. 3F illustrate views 1a and 1b of EM test structure 1 after lifting off first photoresist 44, which removes first barrier layer 46 and first Cu metallization layer 48 in unwanted areas and leaves first Cu line 10a exposed.

Figure 3I:
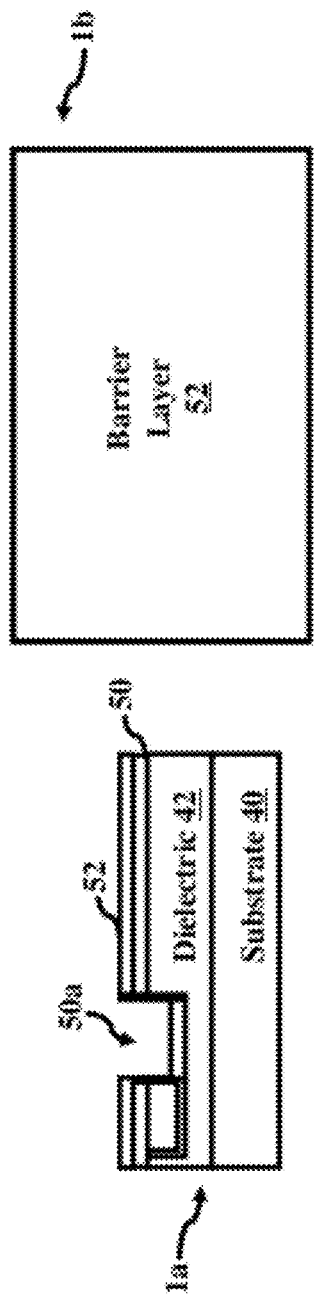
Figure 3J:
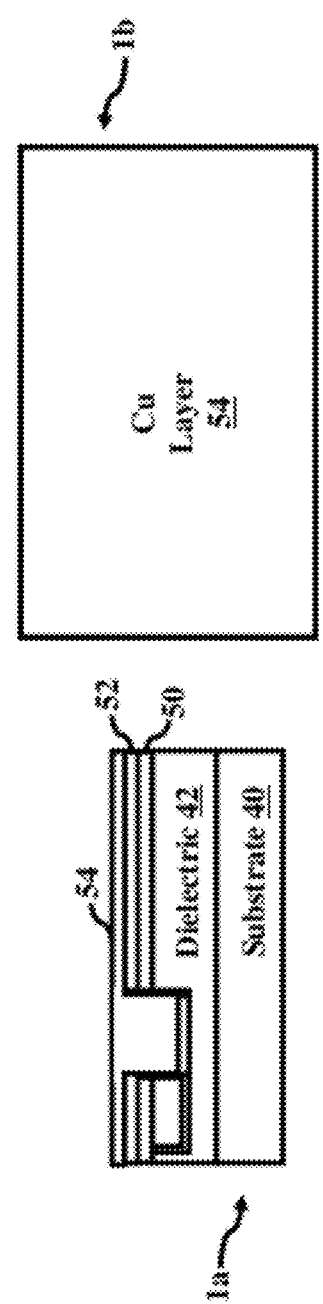
Figure 3K:
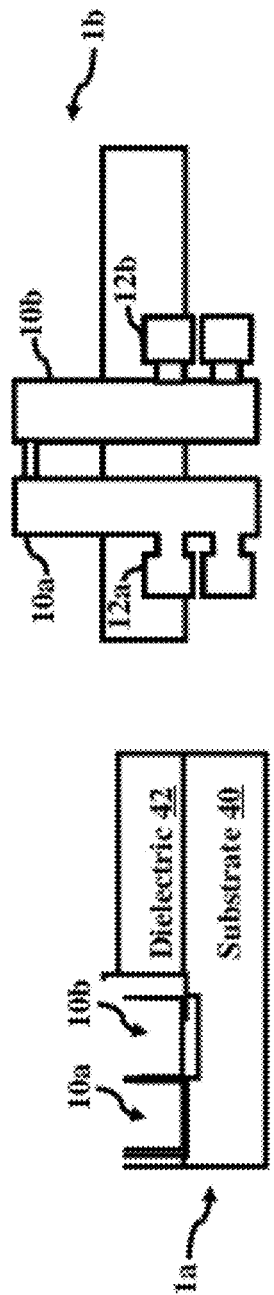
Figure 3L:
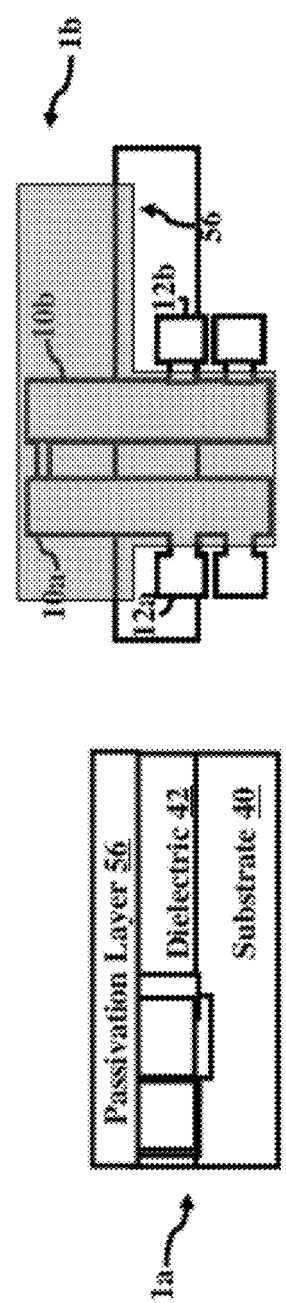

FIG. 3G illustrates a second photoresist layer 50 deposited onto dielectric 42 and patterned with pattern 50a that exposes a second metal line (e.g., second Cu line 10b) and a second set of contact pads (e.g., contact pad 12b). FIG. 3H illustrates that, after second photoresist layer 50 has been patterned, the pattern 50a imprints on dielectric 42 is etched away (e.g., using a wet or a dry etch, etc.) to define the dimensions of a second copper line (e.g., second Cu line 10b). FIG. 3I illustrates a blanket deposition (e.g., PVD or ALD, etc.) of a second barrier layer 52 that step covers the patterned dielectric 42. Next, FIG. 3J illustrates a blanket deposition (e.g., PVD, etc.) of a second Cu metallization layer (e.g., second Cu layer 54), which fills the exposed pattern imprint 50a in dielectric 42 to form second Cu line 10b. FIG. 3K views 1a and 1b of EM test structure 1 after lifting off second photoresist 50, which removes unwanted material (e.g., first barrier layer 46 and first Cu layer 54 in unwanted areas) and leaves first Cu line 10a and second Cu line 10b exposed. Next, FIG. 3L illustrates layering passivation layer 56 deposited onto dielectric 42 to cover first Cu line 10a and second Cu line 10b. As shown in FIG. 3L, however, the contact pads (e.g., contact pad 12a and contact pad 12b) are not covered by passivation layer 56 and are therefore left exposed.

FIG. 3M, with reference to FIG. 1A through 3L, illustrates views 1a and 1b of EM test structure 1 during an EM test. As shown in view 1b, the exposed first (e.g., voltage) contact pad 12a is connected to positive voltage source 58a, and current contact pad 13a is connected to positive current source 60a. In addition, the exposed second (e.g., voltage) contact pad 12b is connected to negative voltage source 58b, and current contact pad 13b is connected to negative current source 60b. Together, positive voltage source 58a and negative voltage source 58b are connected to voltage contact pad 12a and voltage contact pad 12b, respectively. In addition, positive current source 60a and negative current 60b are connected to current contact pad 13a and current contact pad 13b, respectively. Additionally, according to one embodiment herein, lifetime and reliability tests, such as an EM test, are performed on EM test structure 1 under accelerated conditions, such as at an elevated temperature (e.g., approximately 300° C.), to accelerate device failure and thereby simulate normal wear and tear over a prolonged period of use for an active device. As current is applied from positive current source 60a and negative current source 60b, electron flow travels from second Cu line 10b, across Cu bridge 20, and to first Cu line 10a. Under testing conditions, when current is applied, Cu bridge 20 and bridge barrier layer 25 are subjected to elevated current densities (e.g., approximately 10-15 amp/cm²) to test the reliability of Cu bridge 20 and bridge barrier layer 25 (e.g., to determine the mean time to failure, as shown in FIG. 2B). The Cu bridge 20 and bridge barrier layer 25 are designed to simulate a via having a barrier layer. Therefore, as the bridge barrier layer 25 is varied, the optimal material composition and processing conditions used to form the bridge barrier layer 25 may be identified. This is valuable because other conventional test structures cannot effectively simulate and test via reliability performance in next generation scale vias.

For example, according to one embodiment herein, test vias include high aspect ratio vias (e.g., between 2:1 and 18:1 with respect to Cu Line 10a, 10b) and/or are fabricated using fabrication equipment designed to fabricate 90-nanometer nodes and beyond.

Figure 4A:
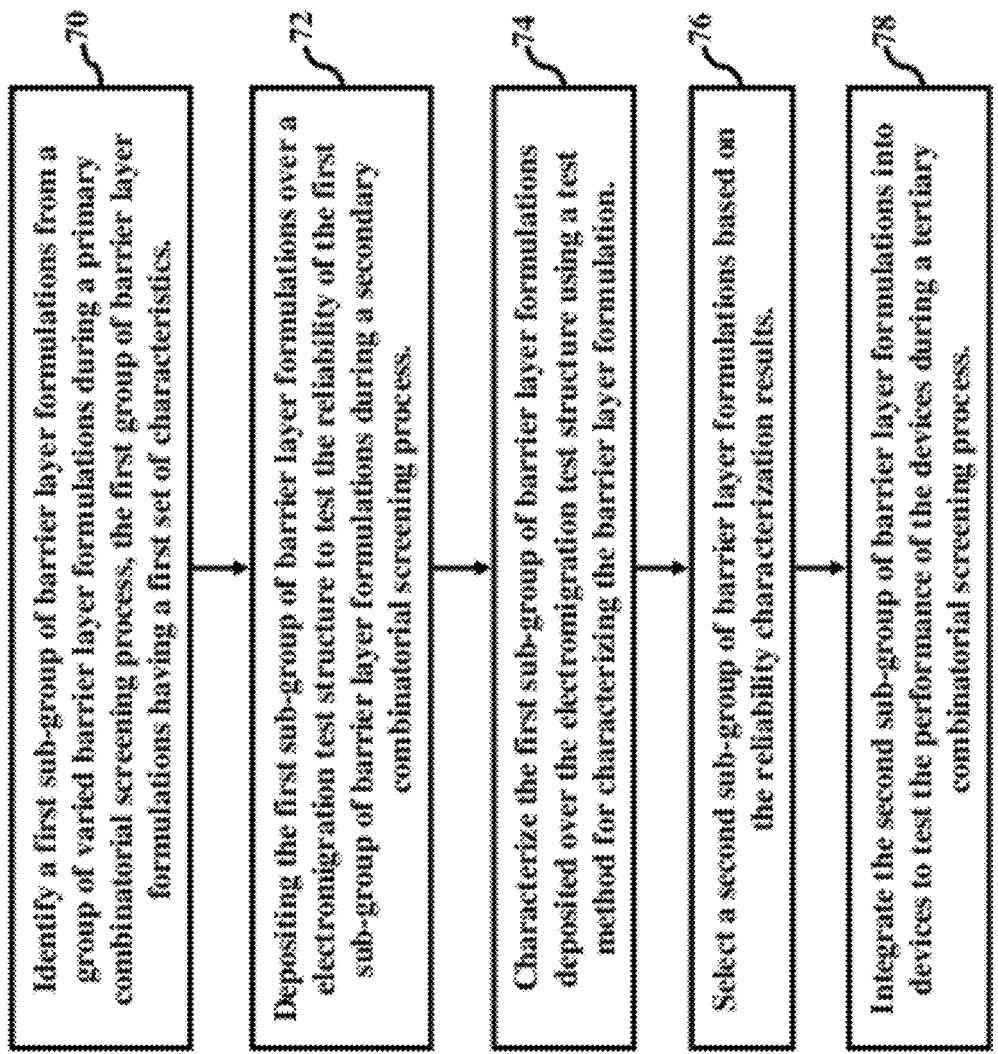
FIG. 4A illustrates a flow diagram of a combinatorial test method according to an embodiment herein.

FIG. 4A, with reference to FIGS. 1 through 3M, illustrates a flow diagram of a combinatorial test method according to an embodiment herein. According to one embodiment herein, FIG. 4A illustrates a method of processing that includes a step (70) of identifying a first sub-group of barrier layer formulations (e.g., barrier layer 15) from a group of varied barrier layer formulations (not shown) during a primary combinatorial screening process (110), the first group of barrier layer formulations (e.g., barrier layer 15) having a first set of characteristics. The next step (72) involves depositing the first sub-group of barrier layer formulations (e.g., barrier layer 15) over an EM test structure (e.g., EM test structure 1) to test the reliability of the first sub-group of barrier layer formulations (e.g., barrier layer 15) during a secondary combinatorial screening process (120). Thereafter, step (74) includes characterizing the first sub-group of barrier layer formulations (e.g., barrier layer 15) deposited over the EM test structure 1 using a test method for characterizing the barrier layer formulation (e.g., barrier layer 15), where the test method includes a first destructive test conducted at an elevated temperature on a first substrate (e.g., substrate 40) comprising the EM test structure 1. The next step (76) involves selecting a second sub-group of barrier layer formulations (e.g., barrier layer 170) based on the reliability characterization results. Finally, step (78) provides integrating the second sub-group of barrier layer formulations (e.g., barrier layer 170) into devices to test the performance of the devices during a tertiary combinatorial screening process (e.g., tertiary screening process (130) of FIG. 1A).

FIG. 4B, with reference to FIGS. 1A through 4A, illustrates a flow diagram of a testing method according to the embodiments herein. According to one embodiment herein, the method shown in FIG. 4B is for evaluating materials, unit processes, and process sequences for manufacturing a device and includes providing (80) a first substrate (e.g., substrate 40) and a second substrate (e.g., SiN layer 160), each substrate comprising only a first metallization layer (e.g., first Cu layer 48 or second Cu layer 54) and an EM test structure (e.g., EM test structure 1); processing (82) regions on the first substrate (e.g., substrate 40) by combinatorially varying at least one of materials, unit processes, and process sequences associated with manufacturing the first substrate (e.g., substrate 40); performing (84) a first reliability test on the processed regions on the first substrate (e.g., substrate 40) to generate first results; processing (86) regions on a second substrate (e.g., SiN layer 160) in a combinatorial manner by varying at least one of materials, unit processes, and process sequences associated with manufacturing the second substrate (e.g., SiN layer 160) based on the first results of the first reliability test; performing (88) a second reliability test on the processed regions on the second substrate (e.g., SiN layer 160) to generate second results; and determining (90) whether the first substrate (e.g., substrate 40) and the second substrate (e.g., SiN layer 160) meet a predetermined quality threshold based on the second results.

Figure 4C:
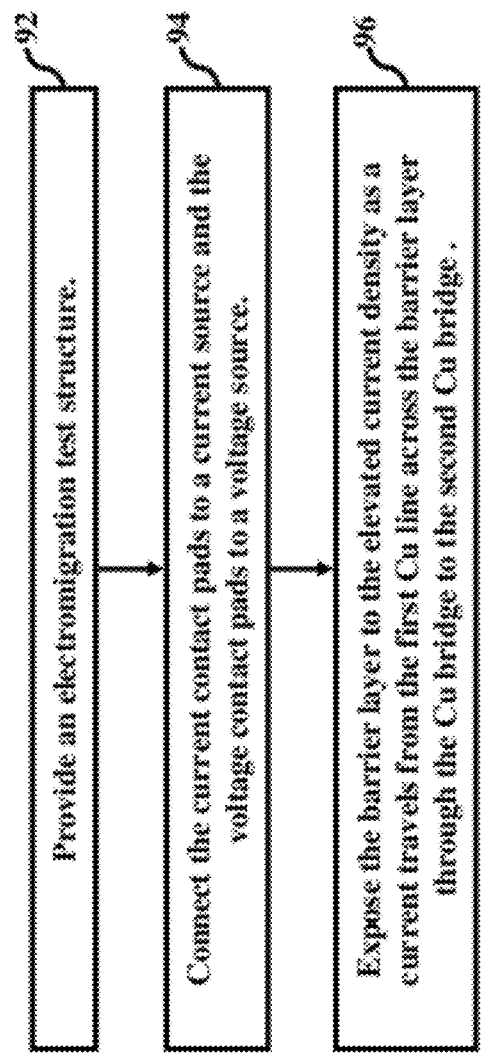
FIG. 4C illustrates a flow diagram of an EM testing method according to an embodiment herein.

FIG. 4C, with reference to FIGS. 1A through 4B, illustrates a flow diagram of an EM testing method according to the embodiments herein. According to one embodiment herein, the method shown in FIG. 4C includes providing (92) an EM test structure (e.g., EM test structure 1). The EM test structure (e.g., EM test structure 1) includes a first metal line (e.g., first Cu line 10a), a metal bridge (e.g., Cu bridge 20) operatively coupled to the first metal line (e.g., first Cu line 10a), a second metal line (e.g., Cu line 10b) operatively coupled to the metal bridge (e.g., Cu bridge 20), a barrier layer (e.g., barrier layer 15) surrounding the EM test structure (e.g., EM test structure 1) and operatively coupled to the first metal line (e.g., first Cu line 10a), the metal bridge (e.g., Cu bridge 20), and the second metal line (e.g., Cu line 10b). Current contact pads (e.g., current contact pad 13a coupled to positive current source 60a and current contact pad 13b coupled to negative current source 60b) and voltage contact pads (e.g., voltage contact pad 12a coupled to positive voltage source 58a and voltage contact pad 12b coupled to a negative voltage source 58b) are also included in the EM test structure 1. In addition, the method shown in FIG. 4C also includes connecting (94) the current contact pads 13a to the current source 60a and the voltage contact pads 12a to the voltage source 58a; and exposing (96) the barrier layer to an elevated current density as a current travels from the first metal line 10a across the barrier layer 15 through the metal bridge 20 and then to the second metal line (e.g., Cu line 10b).

The embodiments herein provide a unique test structure 1 and testing method (e.g., methods according to FIGS. 4A through 4C) to characterize the EM lifetime difference on different barrier materials and process conditions. In contrast with conventional systems, both the metal line (e.g., Cu line 10) and the via (e.g., Cu bridge 20) are configured to be located on a single plane to simplify fabrication of the test structure 1. Thereafter, barrier material (e.g., barrier layer 15) is vertically inserted into the interface (e.g., intersection 175) between copper lines (e.g., Cu line 10) and the via (e.g., bridge barrier layer 25). The configuration provided by the embodiments herein enables greater flexibility during EM testing by tuning the geometry with low process requirements to achieve a broad range of testing conditions.

The use of combinatorial-based rapid device prototyping methods (e.g., as shown in FIG. 1A) permits fabrication, comprehensive characterization, and analysis of hundreds of unique semiconductors and barrier layer formulations on a weekly basis to dramatically increase learning rates. Alternative device structures, process integration schemes, and materials compositions are systematically explored at speeds that would otherwise be impossible using traditional methods and tools.

As described above, the embodiments herein improve the combinatorial screening of and the characterization of compounds (e.g., barrier layer 15) after the application of those formulations. For example, during an initial screening (e.g., primary screening process (110) shown in FIG. 1A), many samples (e.g.,) are tested. This initial screening may have simple criteria (e.g., evaluate the sheet resistance of barrier layer 15 and correlate with physical characteristics, etc.) to allow a quick evaluation and thereby quickly rule out materials that will not undergo the second stage of testing (e.g., in secondary screening process (120) shown in FIG. 1A). During the secondary screening process (120) shown in FIG. 1A, a variety of more specific characterization methods may be performed on the test cleaning formulations identified in primary screening process (110) on fabricated patterned/metallized surfaces. Such characterization methods include parametric tests and reliability tests. Sample criteria to evaluate include, but are not limited to: sheet resistance of materials (e.g., barrier layer 15), EM performance of materials (e.g., barrier layer 15), leakage performance of materials (e.g., barrier layer 15), among other tests.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of several embodiments, those skilled in the art will recognize that the embodiments herein can be practiced with modification within the spirit and scope of the appended claims.

What is claimed is:

1. A method for evaluating materials, unit processes, and process sequences for manufacturing a device, said method comprising:
   providing a first substrate and a second substrate, each substrate comprising only a first metallization layer and an electromigration test structure;
   processing first regions on said first substrate by combinatorially varying at least one of materials, unit processes, and process sequences associated with manufacturing said first substrate;
   performing a first reliability test on the processed first regions on said first substrate to generate first results;
   processing second regions on a second substrate in a combinatorial manner by varying at least one of materials, unit processes, and process sequences associated with manufacturing said second substrate based on said first results of said first reliability test;
   performing a second reliability test on the processed second regions on said second substrate to generate second results; and
   determining whether said first substrate and said second substrate meet a predetermined quality threshold based on said second results.

2. The method of claim 1, wherein said first reliability test and said second reliability test comprise an electromigration test performed on said electromigration test structure.

3. The method of claim 1, wherein said first reliability test and said second reliability test are conducted at approximately 300° C.

4. The method of claim 1, wherein said electromigration test structure comprises:
   a first metal line;
   a metal bridge operatively coupled to said first metal line;
   a second metal line operatively coupled to said metal bridge; and
   a barrier layer operatively coupled to said first metal line, said metal bridge, and said second metal line,
   wherein said first metal line, said metal bridge, and said second metal line are co-planar.

5. The method of claim 4, wherein said electromigration test structure further comprises an interface between said first metal line, said barrier layer, and said second metal line, wherein said interface is exposed to an elevated current density during said electromigration test.

6. The method of claim 5, wherein said elevated current density is between approximately 10 amp/cm$^2$ and 15 amp/cm$^2$.

7. A method of processing comprising:
   identifying a first sub-group of barrier layer formulations from a group of varied barrier layer formulations during a primary combinatorial screening process, said first group of barrier layer formulations having a first set of characteristics;
   depositing said first sub-group of barrier layer formulations over an electromigration test structure to test the reliability of said first sub-group of barrier layer formulations during a secondary combinatorial screening process;
   characterizing said first sub-group of barrier layer formulations deposited over said electromigration test structure using a test method for characterizing said barrier layer formulation, said test method comprising a destructive test conducted at an elevated temperature on a first substrate comprising said electromigration test structure;
   selecting a second sub-group of barrier layer formulations based on the reliability characterization results; and
   integrating said second sub-group of barrier layer formulations into devices to test the performance of said devices during a tertiary combinatorial screening process.

8. The method of claim 7, wherein said elevated temperature is approximately 300° C.

9. The method of claim 7, wherein said electromigration test structure comprises:
   a first metal line;
   a metal bridge operatively coupled to said first metal line;
   a second metal line operatively coupled to said metal bridge; and
   a barrier layer operatively coupled to said first metal line, said metal bridge, and said second metal line.

10. The method of claim 9, wherein said first metal line, said metal bridge, and said second metal line are co-planar.

11. The method of claim 10, wherein said electromigration test structure further comprises an interface between said first metal line, said metal bridge, said barrier layer, and said second metal line, wherein said interface is exposed to an elevated current density during said test method.

12. The method of claim 10, wherein said elevated current density is between approximately 10 amp/cm$^2$ and 15 amp/cm$^2$.

13. The method of claim 11, wherein said test method comprises varying a metal line width relative to a metal bridge width to adjust said elevated current density.

14. The method of claim 9, wherein said electromigration test structure is fabricated with a 90 nanometer (nm) fabrication process.

15. The method of claim 9, wherein said electromigration test structure further comprises:
   at least one current contact pad operatively coupled to said first metal line and said second metal line; and
   at least one voltage contact pad operatively coupled to said first metal line and said second metal line.

16. The method of claim 15, wherein said test method comprises connecting said current contact pads to a current source and said voltage contact pads to a voltage source, and wherein current travels from said first metal line across said barrier layer through said metal bridge to said second metal line, and exposes said barrier layer to said elevated current density.

17. An apparatus for testing electromigration reliability of a material, said apparatus comprising:
   an electromigration test structure comprising:
   a first metal line;
   a metal bridge operatively coupled to said first metal line;
   a second metal line operatively coupled to said metal bridge;
   a barrier layer surrounding said electromigration test structure;

at least one voltage contact pad operatively coupled to said first metal line and said second metal line; and at least one current contact pad operatively coupled to said first metal line and said second metal line;

a voltage source operatively connected to said at least one voltage contact pad, wherein said voltage source provides a voltage to said electromigration test structure; and a current source operatively connected to said at least one current contact pad, wherein said barrier layer is exposed to an elevated current density as current travels from said current source to said current contact pads to said first metal line across said barrier layer through said metal bridge to said second metal line.

18. The apparatus of claim 17, wherein said first metal line, said metal bridge, and said second metal line are co-planar.

19. The apparatus of claim 17, wherein said electromigration test structure further comprises an interface between said first metal line, said barrier layer, and said second metal line, wherein said interface is exposed to said elevated current density during application of said current.

20. The apparatus of claim 17, wherein said elevated current density is between approximately 10 amp/cm$^2$ and 15 amp/cm$^2$.

* * * * *